US007439753B2

(12) United States Patent
Chou et al.

(10) Patent No.: US 7,439,753 B2

(45) Date of Patent: Oct. 21, 2008

(54) INVERTER TEST DEVICE AND A METHOD THEREOF

(75) Inventors: Chin-Wen Chou, Taipei Hsien (TW); Ying-Nan Cheng, Taipei Hsien (TW); Kuang-Ming Wu, Taipei Hsien (TW); Chin-Biau Chung, Taipei Hsien (TW)

(73) Assignee: Zippy Technology Corp., Hsin-Tien (TW)

( * ) Notice: Subject to any disclaimer, the term of this patent is extended or adjusted under 35 U.S.C. 154(b) by 366 days.

(21) Appl. No.: 11/285,072

(22) Filed: Nov. 23, 2005

(65) Prior Publication Data

US 2007/0165438 A1 Jul. 19, 2007

(51) Int. Cl.
*G01R 31/26* (2006.01)
*G01R 31/00* (2006.01)

(52) U.S. Cl. .................... 324/765; 324/767; 324/158.1; 327/524; 365/201

(58) Field of Classification Search ......... 324/754–770; 365/51, 201; 327/334, 552
See application file for complete search history.

(56) References Cited

U.S. PATENT DOCUMENTS

| | | | | |
|---|---|---|---|---|
| 5,497,095 | A * | 3/1996 | Ueyama et al. | 324/537 |
| 6,861,897 | B1 * | 3/2005 | Cheng et al. | 327/552 |
| 2007/0075649 | A1 * | 4/2007 | Yamashita et al. | 315/159 |
| 2007/0103163 | A1 * | 5/2007 | Hachisuka et al. | 324/500 |

* cited by examiner

*Primary Examiner*—Vinh P. Nguyen
*Assistant Examiner*—Emily Y Chan
(74) *Attorney, Agent, or Firm*—Muncy, Geissler, Olds & Lowe PLLC

(57) ABSTRACT

The present invention discloses an inverter test device and a method thereof, which provides a single-load environment or a multi-load test environment to test electrical performance of an inverter or inverters, including: unbalanced current comparison, phase comparison, current/voltage deviation, and fusion heat ($I^2T$), and record the test results, wherein the test method of the present invention is implemented with the procedures, which can be executed in a computer or a similar device to undertake control and data processing, and the electrical signals acquired by the inverter test device are processed, compared and calculated in order to realize the above-mentioned tests of unbalanced current comparison, phase comparison, current/voltage deviation, and fusion heat ($I^2T$).

13 Claims, 9 Drawing Sheets

INVERTER TEST DEVICE AND A METHOD THEREOF

FIELD OF THE INVENTION

The present invention relates to an inverter test device and a method thereof, particularly to an inverter test device and a method thereof, which are used in testing the electrical performance of inverters.

BACKGROUND OF THE INVENTION

The inverter is a power transformer, which converts a direct current into an alternating current. Inverters are extensively used in the backlight module of LCD (Liquid Crystal Display) device to drive gas-discharge lamps, such as CCFL+s (Cold Cathode Fluorescent Lamps), to emit light. The technology of the large-size LCD advances very fast, and the number of the lamps used by the backlight module also grows more and more. At present, LCD inverters trend to be LIPS (LCD Inverter Power Supply, adapter plus inverter) or be used for multi-lamp loads (for LCD TV). Owing to increasing lamp number and lamp length in LCD, the drive circuit of an inverter becomes further complicated. Therefore, to secure product quality, the manufacturers pay much attention to the test of the related electrical performance of inverters.

A Taiwan Patent Publication No. I224628 discloses a "Test Device of Inverters", which comprises: a power supply module, providing power for the test device; an inverter drive module, providing drive power for the inverter, and modulating output signals; and a load module, emulating a single-load environment or a multi-load environment. Such a test device can provide single-load and multi-load inverter tests, and the modularized design thereof enables the test device to be easily modified according to the user's requirement.

However, the abovementioned technology only discloses the hardware of the test device, and none of the method of utilizing computer programs to test inverters automatically is disclosed therein.

SUMMARY OF THE INVENTION

The present invention proposes an inverter test method, which can be used to test the electrical performance of inverters, including: unbalanced current comparison, phase comparison, current/voltage deviation, and fusion heat ($I^2T$), and record the test results.

According to one preferred embodiment of the present invention, the inverter test device of the present invention comprises: a test platform, having an input end and an output end, and used to carry tested inverters; a power supply unit, coupled to the input end of the test platform, and providing power for the inverters; a power supply-current detection unit, used to obtain power supply-current signals; a load platform, used to carry tested loads; a power-control switch, coupled to and interposed between the power supply unit and the primary side of the inverter, and used to switch on/off the power for the inverter; a current/voltage detection unit, used to obtain consumed-current signals of the loads and voltage signals of the input ends of the loads; a primary processing unit, responsible for controlling the test process and processing the data calculation; a signal converting unit, used to convert the power supply-current signals, the consumed-current signals, and the voltage signals into corresponding digital signals; and a multiplex selector, controlled by the primary processing unit, and used to selectively transmit the power supply-current signals, the consumed-current signals, and the voltage signals to the signal converting unit.

According to one preferred embodiment, the inverter test method of the present invention comprises an electrical signal-acquiring process and a signal-processing process. The electrical signal-acquiring process is to acquire the electrical signals of the tested inverters. The signal-processing process is to utilize the procedures, which can be executed in a computer or a similar device to undertake control and data processing, to process, compare and calculate the electrical signals acquired by the former electrical signal-acquiring process in order to implement the abovementioned tests of unbalanced current comparison, phase comparison, current/voltage deviation, and fusion heat ($I^2T$) and the recording of the test results.

The technical contents and preferred embodiments of the present invention are to be described below in cooperation with the drawings.

DETAILED DESCRIPTION OF THE PREFERRED

Embodiments

According to the proposed preferred embodiments, the present invention includes a hardware aspect and a software aspect and may apply to either a single-load test or a multi-load test; the tested load element may be a CCFL or an equivalent impedance or circuit.

Figure 1:
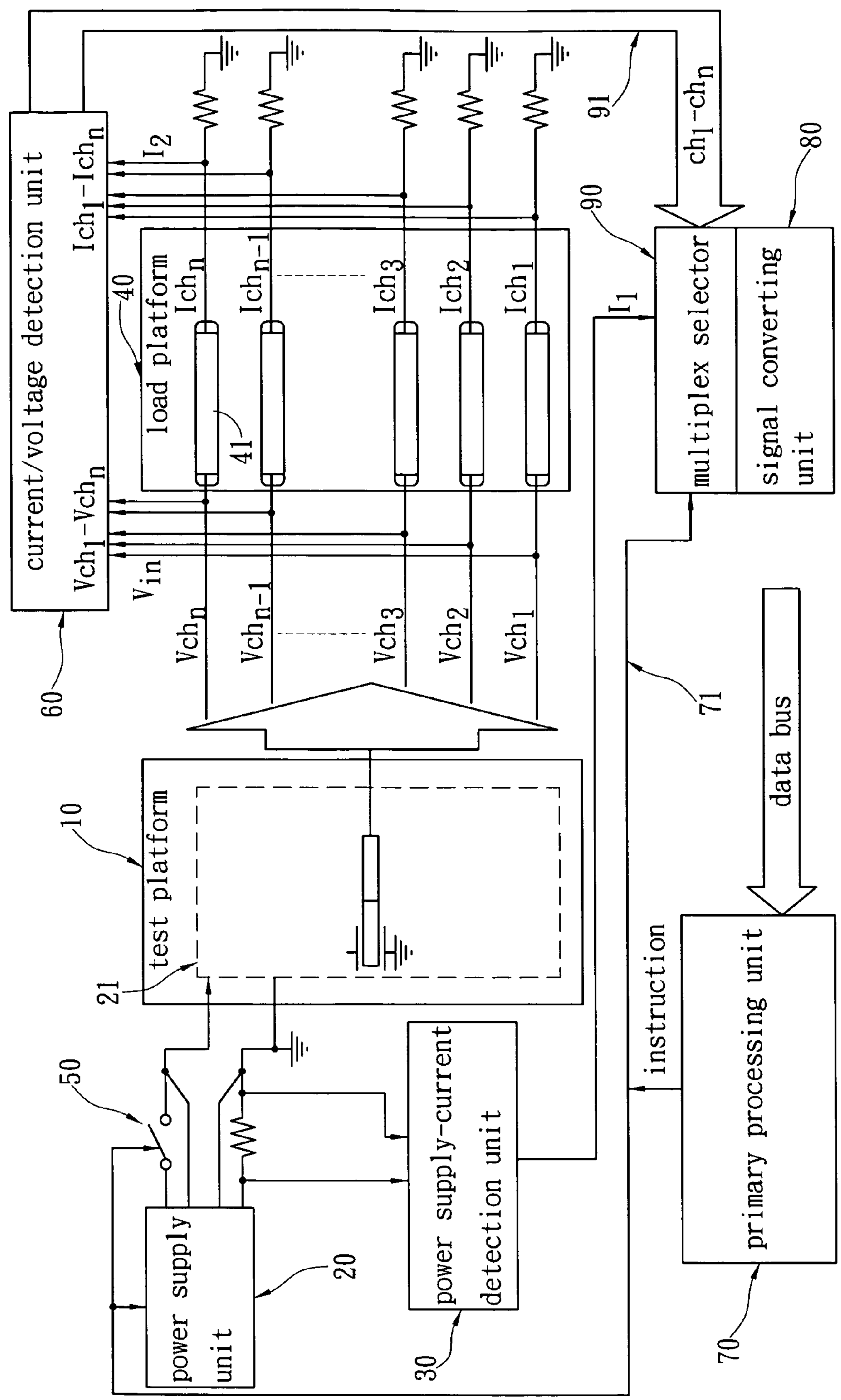
FIG. 1 is a block diagram showing one preferred embodiment of the inverter test device of the present invention.

The preferred embodiments of the inverter test method disclosed in the present invention are implemented with the control and data-processing procedures executed in a computer or a similar device. The electrical signals of the tested inverter are obtained with the inverter test device in the hardware aspect of the present invention. As shown in FIG. 1, the inverter test device of the present invention comprises:

A test platform 10, used to carry one or multiple tested inverters 21, wherein the input power sources of multiple inverters 21 are commonly connected to each other, and the high-voltage outputs of the secondary sides of the inverters 21 are separately independent signal channels $Vch_n$ (n=1~n);

A power supply unit 20, providing power for the inverters 21;

A power supply-current detection unit 30, used to obtain a power supply-current signal $I_1$;

A load platform 40, used to carry one or multiple tested loads 41, wherein the load 41 may be a CCFL; the input end of the load 41 is coupled to the secondary side of the inverter 21; the inverter 21 drive the CCFL to light up; the output end of the load 41 is coupled to a current-sampling channel $Ich_n$ (n=1~n); a consumed-current signal $I_2$ is obtained via the current-sampling channel $Ich_n$ (n=1~n); the drive circuit topology may vary according to requirements, such as a push-pull drive circuit or a polyphase drive circuit;

A power-control switch 50, coupled to and interposed between the power supply unit 20 and the primary side of the inverter 21, and used to switch on/off the power for the inverters 21;

A current/voltage detection unit 60, obtaining the consumed-current signal $I_2$ of the load 41 from the current-sampling channels $Ich_n$ (n=1~n) and a voltage signal $V_{in}$ of the input end of the load 41 from the signal channels $Vch_n$ (n=1~n);

A primary processing unit 70, responsible for the control of the test process and the calculation of data processing, and, having test programs, wherein the primary processing unit 70 instructs the power supply unit 20, the power-control switch 50, and a multiplex selector 90 via control lines 71 to perform the tests of unbalanced current comparison, phase comparison, current/voltage deviation test, and fusion heat ($I^2T$) measurement, and record the test results;

A signal converting unit 80, used to convert the power supply-current signals $I_1$, the consumed-current signals $I_2$, and the voltage signals $V_{in}$ into corresponding digital signals, wherein the corresponding digital signals is transmitted via a data bus to the primary processing unit 70 and then processed there; and A multiplex selector 90, coupled to the current/voltage detection unit 60 via multiple signal channels 91 ($ch_1$~$ch_n$), controlled by the primary processing unit 70, and used to selectively transmit the power supply-current signal $I_1$, the consumed-current signal $I_2$, and the voltage signal $V_{in}$ to the signal converting unit 80.

According to one embodiment of the inverter test method of the present invention, the test programs inside the primary processing unit 70 include: an unbalanced current comparison program, a phase comparison program, a current/voltage deviation test program, and a fusion heat ($I^2T$) measurement program. The operational processes of them are to be described below.

(A) Unbalanced Current Comparison

Figure 2:
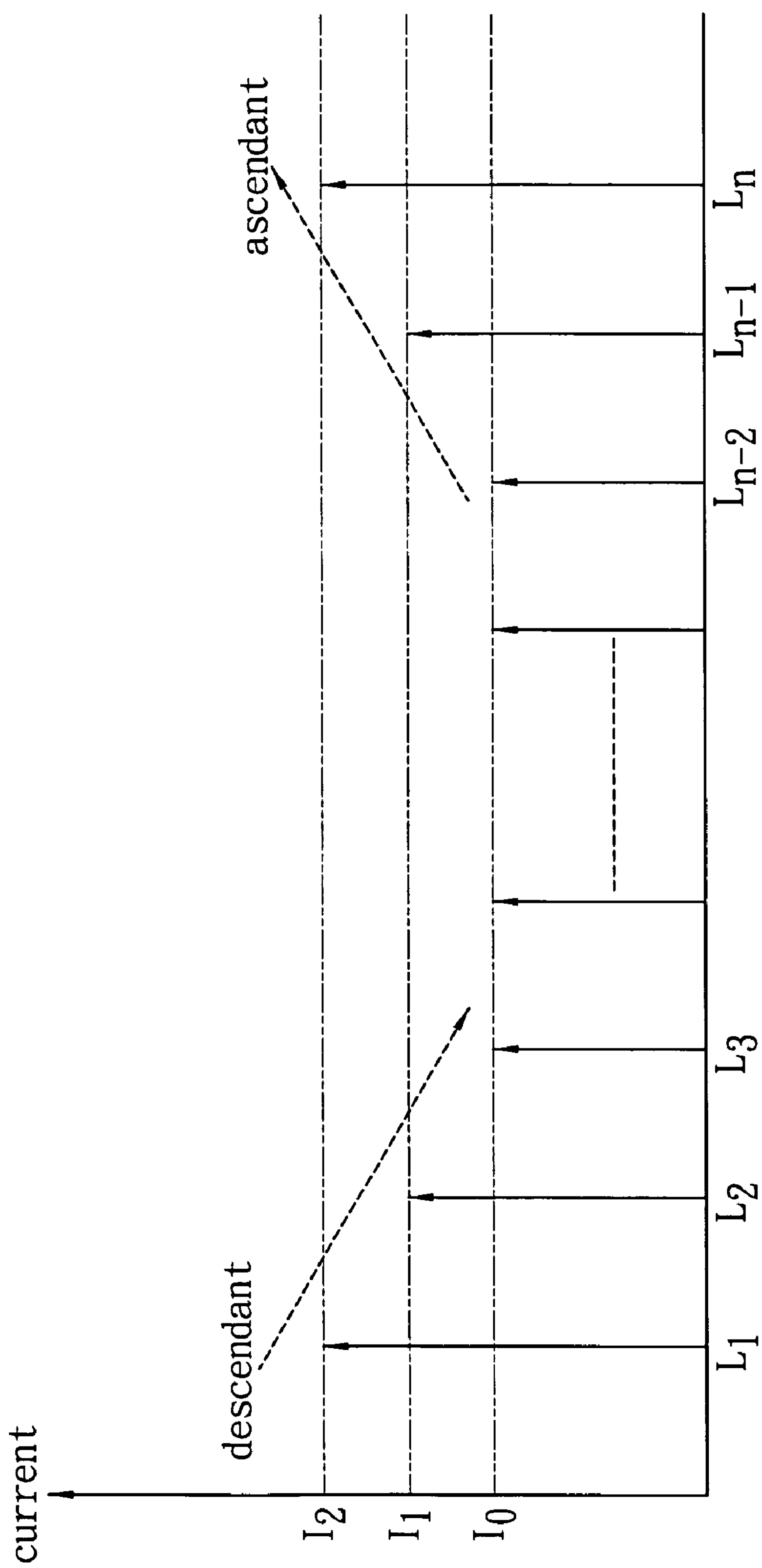
FIG. 2 is a diagram showing the current distribution of multiple lamps.

In general, the backlight source of a larger-size flat panel display has multiple lamps ($L_1$~$L_n$). If an identical quantity of current is provided to each lamp ($L_1$~$L_n$), the brightness will varies in the top/bottom sides and the central portion of the large-size flat panel display; therefore, in practice, the top side lamp (or lamps) and the bottom side lamp (or lamps) will be provided with different quantities of currents. For example, as shown in FIG. 2, a higher quantity of current will be provided for the top side lamps ($L_1$~$L_2$) and the bottom side lamps ($L_{n-1}$~$L_n$) than that for the central-portion lamps ($L_3$~$L_{n-2}$). However, the conventional test method provides only one set of current value and cannot apply to a multi-lamp (multi-load) test.

Figure 3:
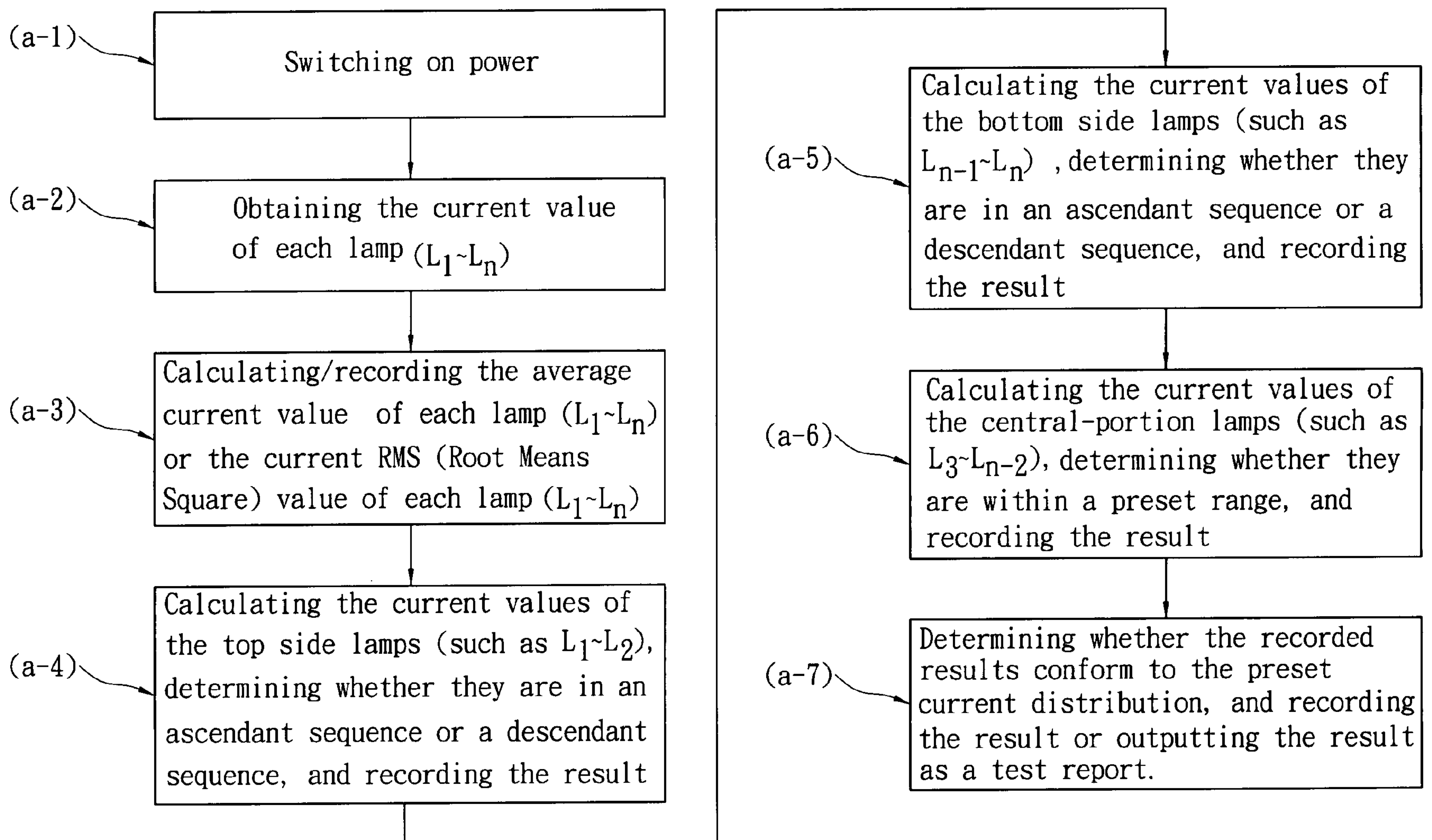
FIG. 3 is a flowchart showing the process of the unbalanced current comparison test according to one preferred embodiment of the present invention.
Figure 4:
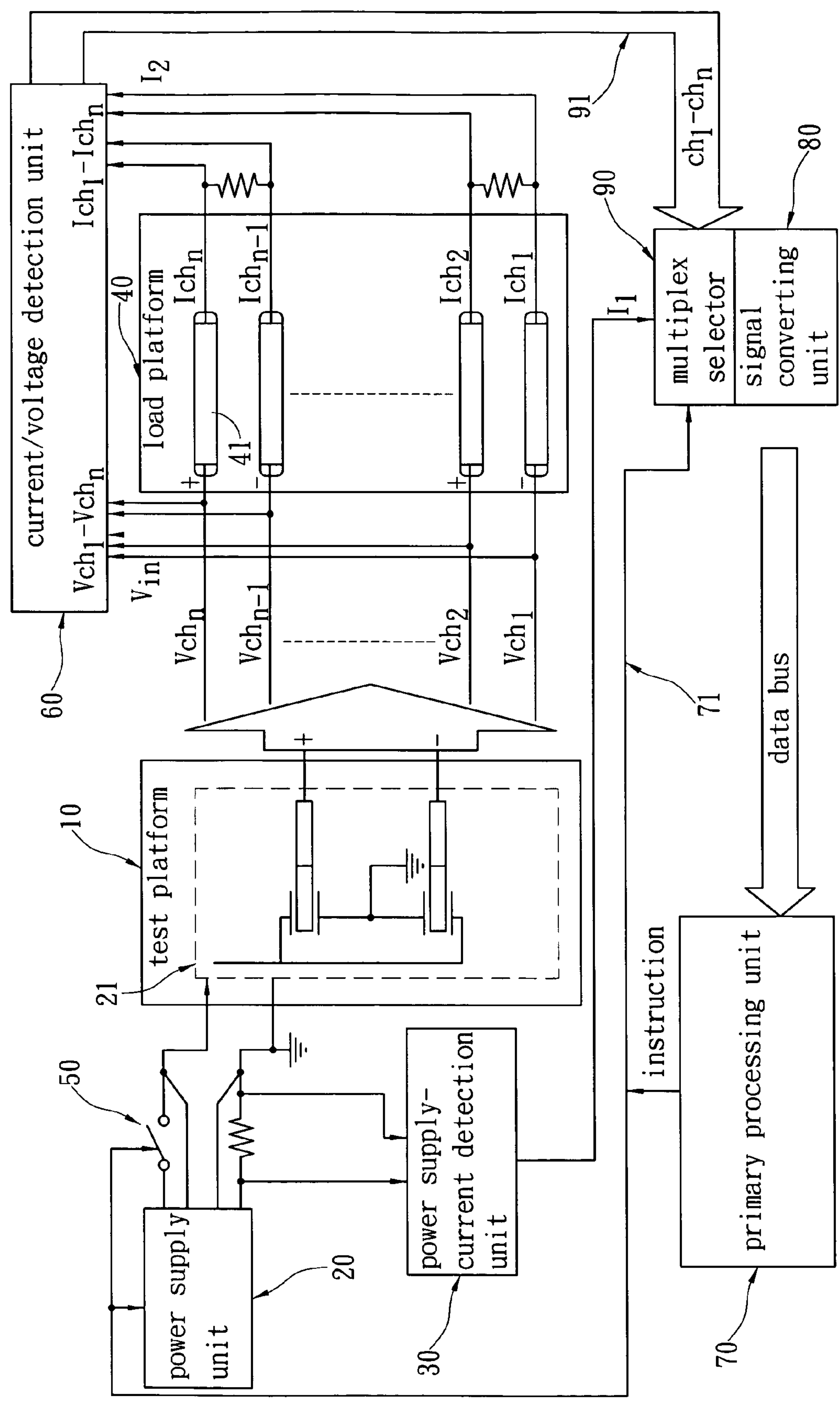
FIG. 4 is a block diagram showing the inverter test device used in a phase comparison test according to one preferred embodiment of the present invention.

The inverter test method of the present invention can utilize the abovementioned inverter test device to perform an unbalanced current test for the multi-load case of different quantities of currents; multiple lamps ($L_1$~$L_n$) are installed to the load platform 40 to form multiple loads 41, and each load 41 is provided with the required current by a corresponding inverter 21, and then, the unbalanced current comparison program undertakes the test according to the following steps. As shown in FIG. 3, the unbalanced current test comprises the following steps:

(a-1) Switching on power: the power-control switch 50 is switched on, and the power supply unit 20 provides power for the inverters 21, and the power supply is maintained for a preset interval so that the system can achieve a stable state;

(a-2) Obtaining the current value of each lamp ($L_1$~$L_n$): the multiplex selector 90 is utilized to select the current-sampling channels $Ich_n$ (n=1~n) in order to obtain the consumed-current signal $I_2$ of the lamp corresponding to each current-sampling channel $Ich_n$ (n=1~n), and then the signal converting unit 80 converts the consumed-current signal $I_2$ into a corresponding digital signal of the current;

(a-3) Calculating/recording the average current value of each lamp ($L_1$~$L_n$) or the current RMS (Root Means Square) value of each lamp ($L_1$~$L_n$): the consumed-current signal $I_2$ of the lamp corresponding to each current-sampling channel $Ich_n$ (n=1~n) is sampled several times, and the values are calculated to obtain the average value or the RMS value;

(a-4) Calculating the current values of the top side lamps (such as $L_1$~$L_2$), determining whether they are in an ascendant sequence or a descendant sequence, and recording the result;

(a-5) Calculating the current values of the bottom side lamps (such as $L_{n-1}$~$L_n$), determining whether they are in an ascendant sequence or a descendant sequence, and recording the result;

(a-6) Calculating the current values of the central-portion lamps (such as $L_3$~$L_{n-2}$), determining whether they are within a preset range, and recording the result; and (a-7) Determining whether the recorded results conform to the preset current distribution: whether the current values of the lamps ($L_1$~$L_n$) conform to the preset current distribution is determined, and the result is recorded and output as a test report.

(B) Phase Comparison

Figure 5A:
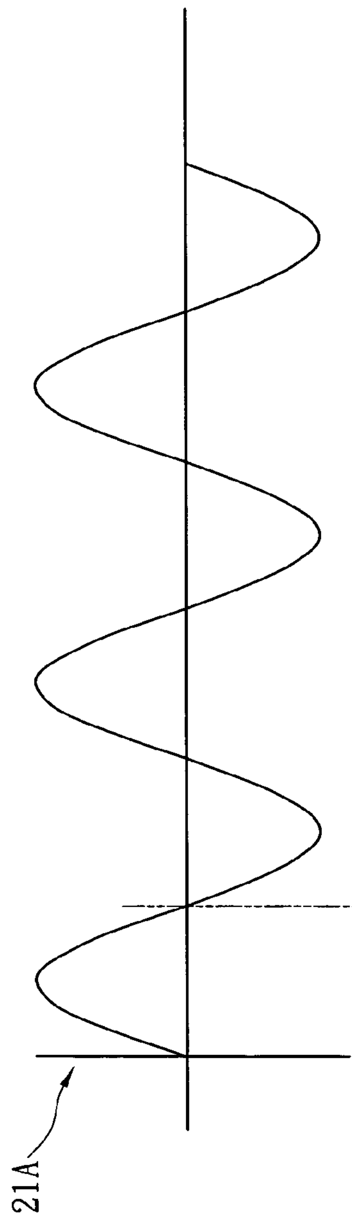
FIG. 5A and FIG. 5B are diagrams showing the phase difference between two inverters used in the push-pull drive mode.
Figure 5B:
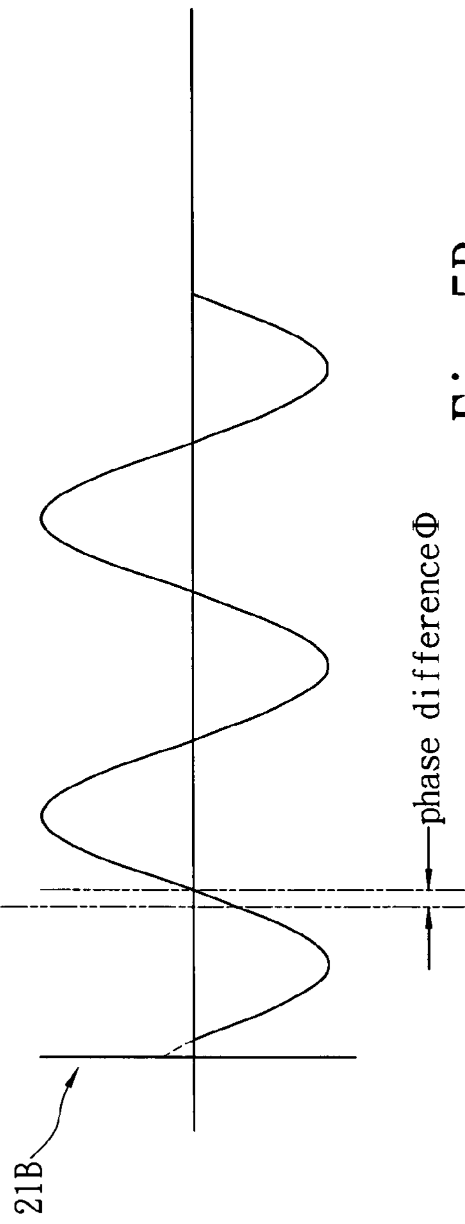

As shown in FIGS. 5A and 5B, the phase comparison is exemplified with a push-pull drive circuit herein. As two inverters 21A, 21B are coupled into one set to drive the load 41 (i.e. the lamp) in a two-phase way, the phase difference therebetween should be maintained within a given range lest the lamp cannot be lighted up. Therefore, the phase test of the inverters 21A, 21B is very important.

Figure 6:
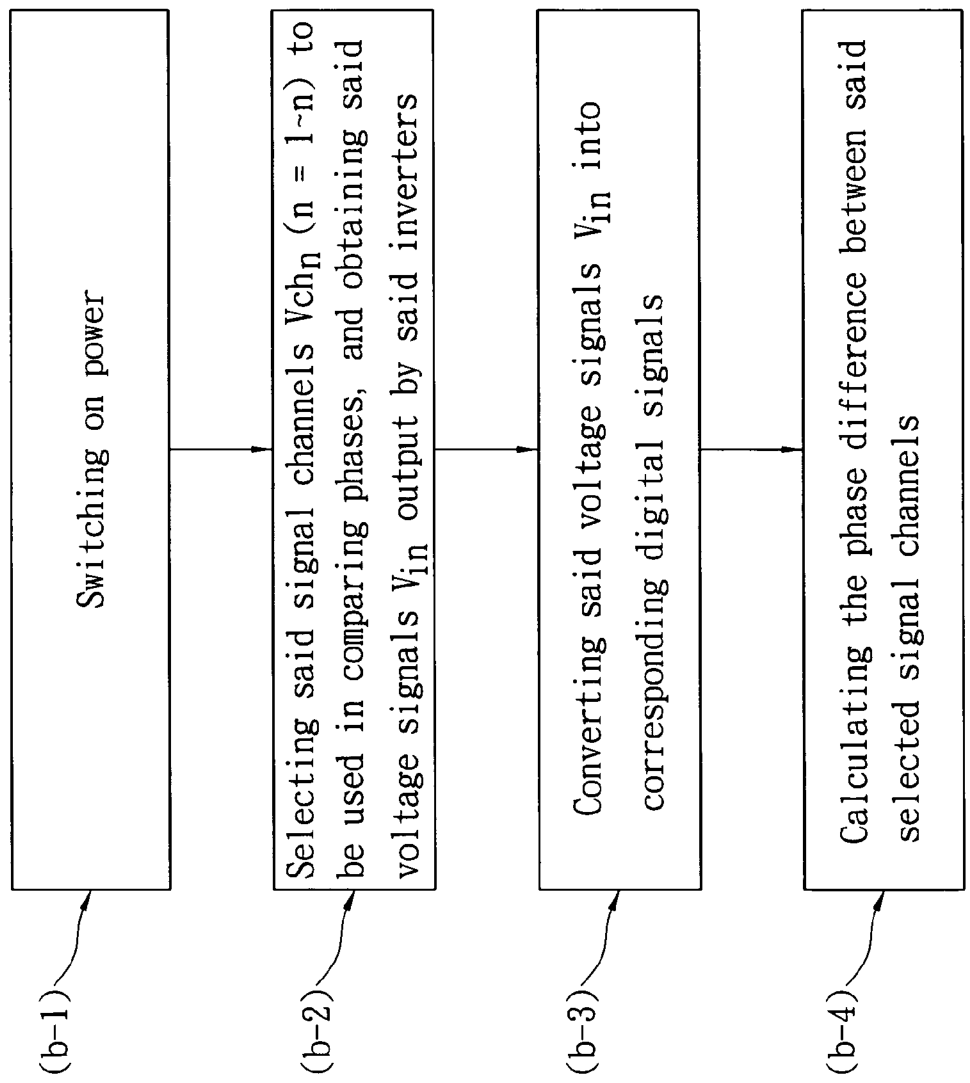
FIG. 6 is a flowchart showing the process of the phase comparison test according to one preferred embodiment of the present invention.

As shown in FIG. 6 (flowchart), the phase comparison test comprises the following steps:

(b-1) Switching on power: the power-control switch 50 is switched on, and the power supply unit 20 provides power for the inverters 21A, 21B, and the power supply is maintained for a preset interval so that the system can achieve a stable state;

(b-2) Selecting the signal channels $Vch_n$ (n=1~n) to be used in comparing phases, and obtaining the voltage signals $V_{in}$ output by the inverters 21A, 21B: the multiplex selector 90 is utilized to select the signal channels $Vch_n$ (n=1~n) to be used in comparing phases, and the current/voltage detection unit 60 is used to obtain the voltage signals $V_{in}$;

(b-3) Converting the voltage signals $V_{in}$ into corresponding digital signals: the signal converting unit 80 converts the voltage signals $V_{in}$ into corresponding digital signals in order to obtain the voltage values; and (b-4) Calculating the phase difference between the signal channels $Vch_1$, $Vch_2$: under the condition that the signal channels $Vch_1$, $Vch_2$ cross three cross-zero points, the distances between cross-zero points of the voltage values of the signal channels $Vch_1$, $Vch_2$ are compared to obtain the phase difference between the signal channels $Vch_1$, $Vch_2$.

Although the phase comparison is exemplified above with a two-phase drive circuit, the persons skilled in the art should be able to perform the phase comparison of a three-phase drive circuit or a four-phase drive circuit via the instruction of the preferred embodiment mentioned above.

(C) Power Waveform Deviation Test

Figure 7:
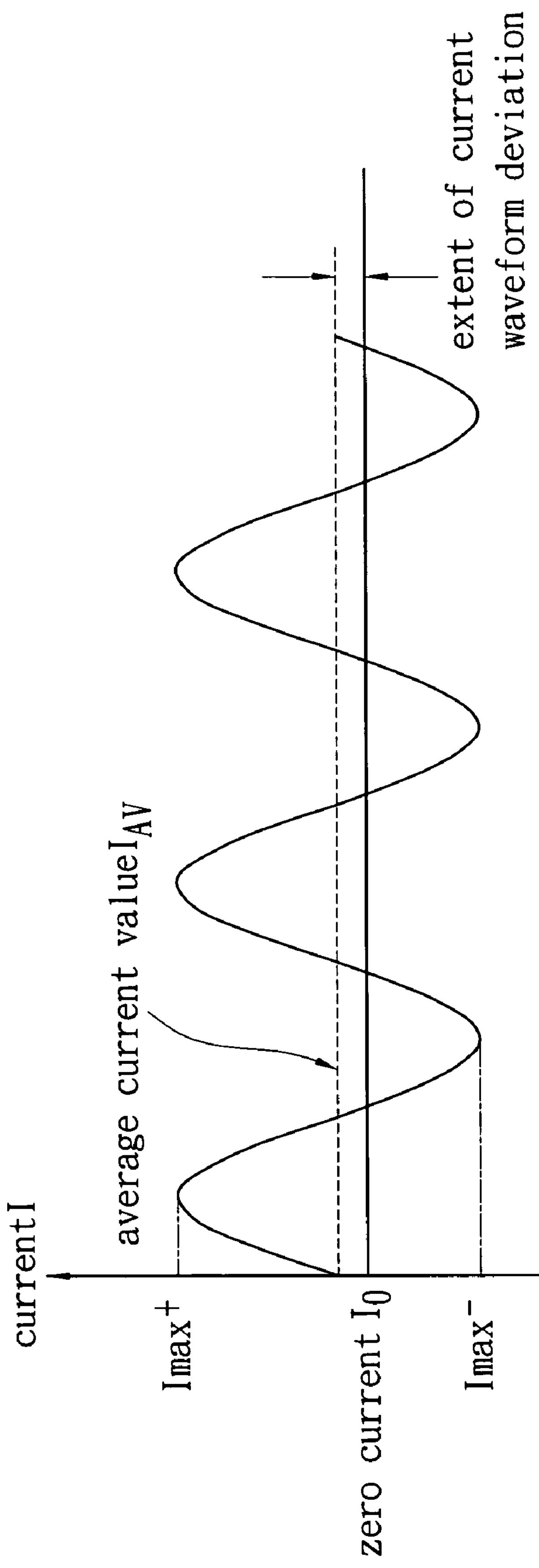
FIG. 7 is a diagram showing the power waveform deviation of an inverter.

In theorem, the power waveform output by the inverter 21 should have symmetrical positive and negative semi-cycles; however, owing to some factors, such as an asymmetrical hysteresis curve, or internal malfunctions during polarity conversion, waveform deviation may occur. As shown in FIG. 7 an example of current waveform deviation, in a single cycle, the maximum current value $Imax^+$ of the positive semi-cycle does not equal to the absolute vale of the maximum current value $Imax^-$ of the negative semi-cycle. The difference between the average current value $I_{AV}$ in a single cycle and the zero current $I_0$ (i.e. current value is zero) may be used to express the extent of current waveform deviation. The difference between the current waveform areas of the positive and negative semi-cycles may also used to express the extent of current waveform deviation. Similarly, The difference between the average voltage value $V_{AV}$ in a single cycle and the zero voltage $V_0$ may be used to express the extent of voltage waveform deviation, and the difference between the voltage waveform areas of the positive and negative semi-cycles may also used to express the extent of voltage waveform deviation. In theorem, the maximum current or voltage, and the minimum current or voltage of only a single cycle are enough to perform a power waveform deviation calculation, but for more accurate result, it is preferred that the deviation be calculated from several cycles of waveforms.

Figure 8:
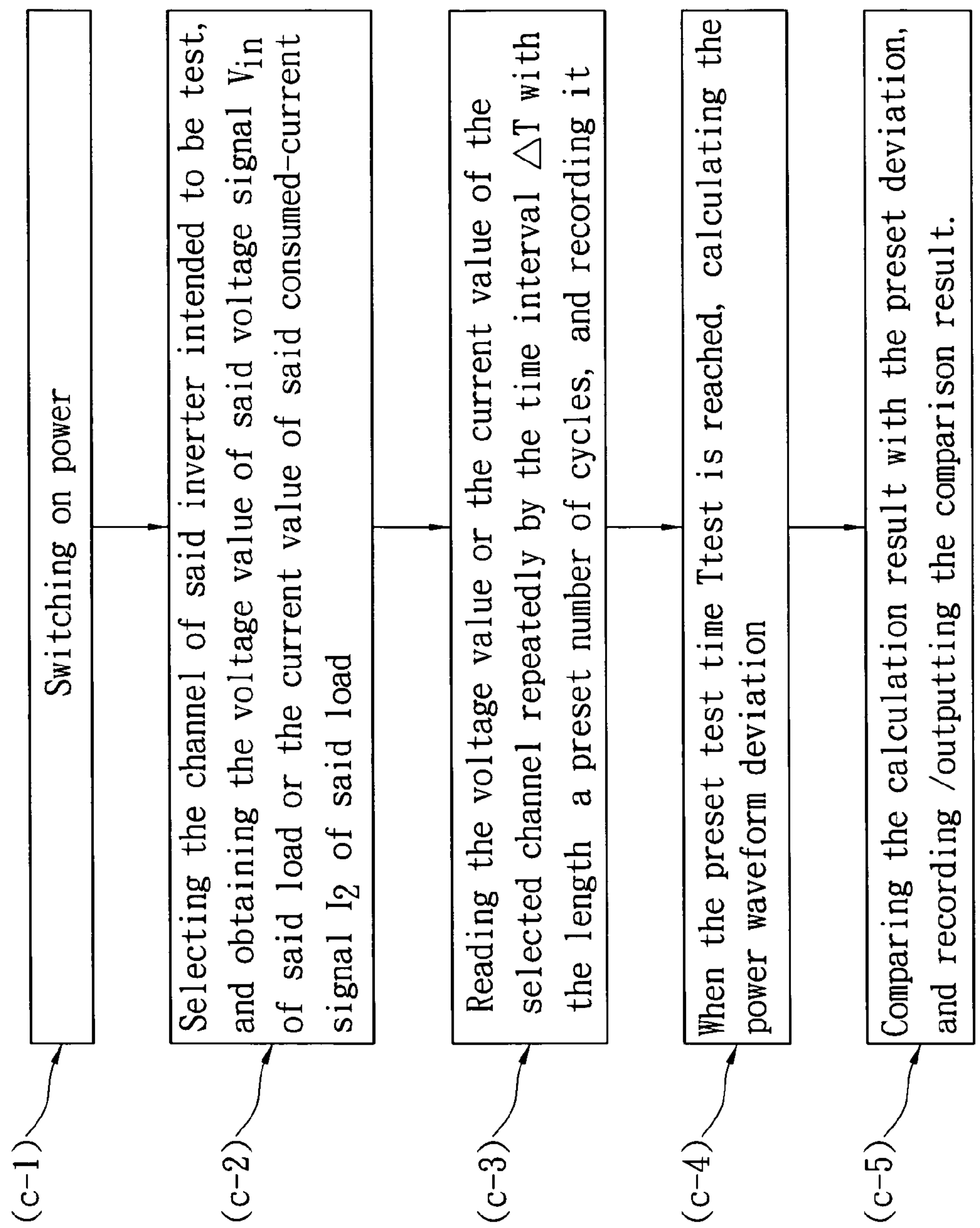
FIG. 8 is a flowchart showing the process of the power waveform deviation test according to one preferred embodiment of the present invention.

According to the preferred embodiment of the present invention, the power waveform deviation test is to test the deviation of current or voltage. As shown in FIG. 8, the process of the deviation test comprises the following steps:

(c-1) Switching on power: the power-control switch 50 is switched on, and the power supply unit 20 provides power for the inverter 21, and the power supply is maintained for a preset interval so that the system can achieve a stable state;

(c-2) Selecting the channel ($Vch_n$ or $Ich_n$ shown in FIG. 1) of the tested inverter 21, and obtaining the voltage value of the voltage signal $V_{in}$ of the input end of the load 41 or the current value of the consumed-current signal $I_2$ of the load 41: the current/voltage detection unit 60 is used to obtain the voltage values of the voltage signals $V_{in}$ or the current values of the consumed-current signals $I_2$, and the multiplex selector 90 is used to select the channel intended for the deviation test (such as $Vch_1$ or $Ich_1$), and then, the signal converting unit 80 converts the voltage signals $V_{in}$ or the consumed-current signals $I_2$ into corresponding digital values of voltage or current;

(c-3) Reading the voltage value or the current value of the selected channel ($Vch_1$ or $Ich_1$) repeatedly by the time interval $\Delta T$ of the length of a preset number of cycles, and recording it;

(c-4) When the preset test time T test is reached, calculating the power waveform deviation according to Formulus-1:

$$\text{Power waveform deviation}=(\Sigma Imax^+ - \Sigma Imax^-)/\text{average value (or RMS value)} \quad \text{(Formulus-1)};$$

and (c-5) Comparing the calculation result with the preset deviation, and recording /outputting the comparison result.

(D) Fusion Heat ($I^2T$) Test

The fuse plays a critical role in circuit protection, and the basic demand for a fuse is: it should not fuse when unnecessary (e.g. when there is a surge current) and must fuse when necessary (e.g. there is an overload current). Therefore, it is very important to select an appropriate specification of fuse. In general, fusion heat is usually adopted as the object of the measurement in a fuse test. Fusion heat refers to the energy required to melt a fuse, and $I^2T$ is often used to calculate the energy required to melt a fuse, wherein I is the input current, and T is the time needed to melt the fuse.

Figure 9:
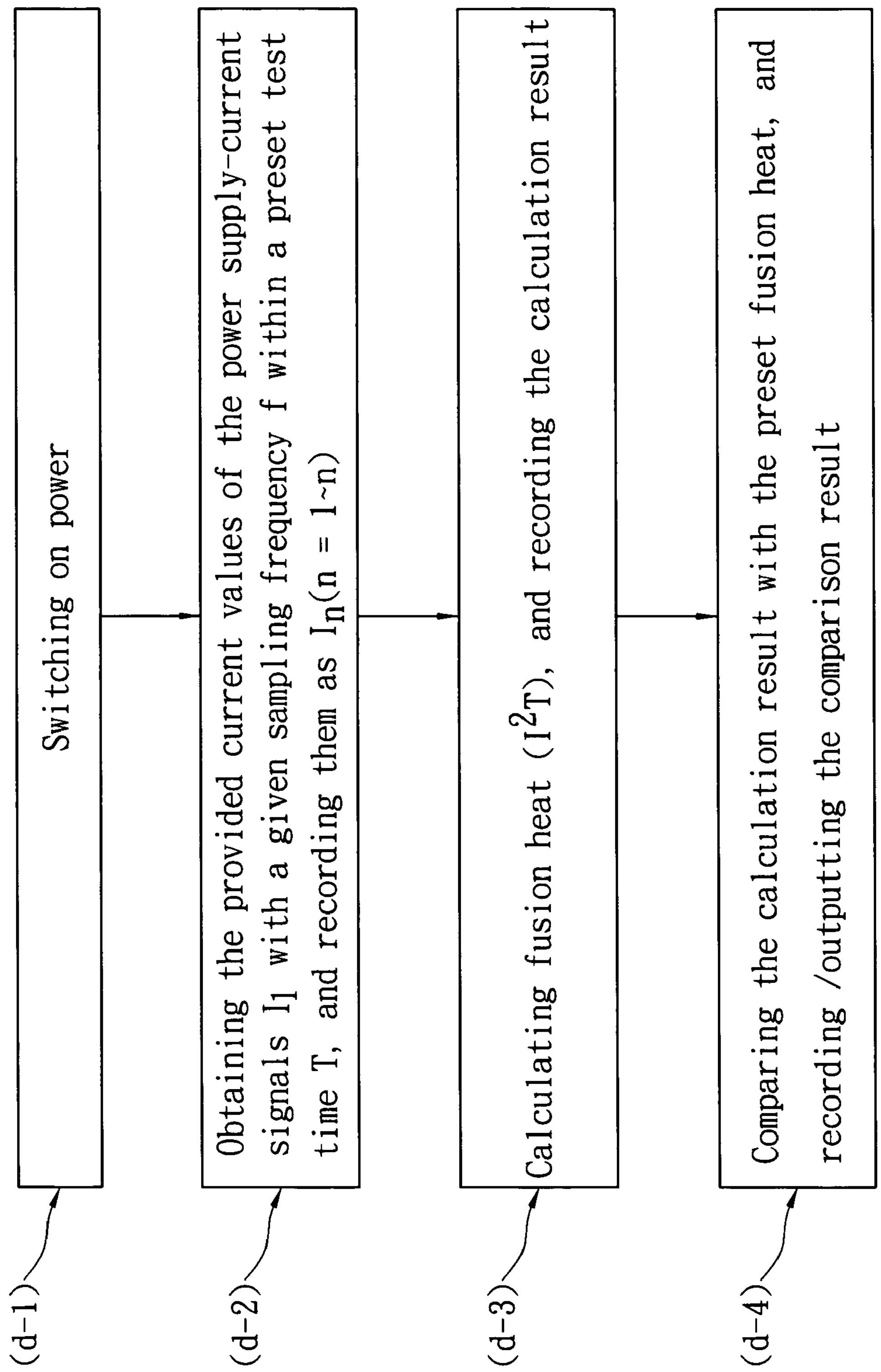
FIG. 9 is a flowchart showing the process of the fusion heat ($I^2T$) test according to one preferred embodiment of the present invention.

According to the preferred embodiment of the present invention, the current provided by the power supply unit 20 is used to calculate fusion heat. As shown in FIG. 9, the process of the fusion heat test comprises the following steps:

(d-1) Switching on power: the power-control switch 50 is switched on, and the power supply unit 20 provides power for the inverter 21;

(d-2) Obtaining the provided current values of the power supply-current signals $I_1$ with a given sampling frequency f within a preset test time T, and recording them as $I_n$(n=1~n), wherein the interval between two sampling actions is $\Delta T$, and $$T = \sum_{n=1}^{n} \Delta T_n;$$

(d-3) Calculating fusion heat ($I^2T$) according to Formulus-2, and recording the calculation result, wherein $$\sum_{n=1}^{n} \Delta T_n \cdot I_n[T_n] \cdot I_n[T_n]; \quad \text{(Formulus-2)}$$

and (d-4) Comparing the calculation result with the preset fusion heat, and recording /outputting the comparison result.

Although the present invention has been disclosed with the abovementioned embodiments, they are not intended to limit the scope of the present invention, and any equivalent modification and variation according to the spirit of the present invention is to be included within the scope of the present invention.

What is claimed is:

1. An inverter test device, comprising:

a test platform, used to carry tested inverters;

a power supply unit, providing power for said inverter;

a power supply-current detection unit, used to obtain a power supply-current signal $I_1$;

a load platform, used to carry one or multiple tested loads, wherein the input end of said load is coupled to the secondary side of said inverter, and the input end of said load is coupled to a signal channel $Vch_n$ (n=1~n); the output end of said load is coupled to a current-sampling channel $Ich_n$ (n=1~n), and a consumed-current signal $I_2$ is obtained via said current-sampling channel $Ich_n$ (n=1~n);

a power-control switch, coupled to and interposed between said power supply unit and the primary side of said inverter, and used to switch on/off the power for said inverter;

a current/voltage detection unit, obtaining said consumed-current signal $I_2$ of said load from said current-sampling channel $Ich_n$ (n=1~n), and obtaining a voltage signal $V_{in}$ of the input end of said load from said signal channels $Vch_n$ (n=1~n);

a primary processing unit, responsible for the control of test process and the calculation of data processing, and having test programs, wherein said primary processing unit instructs said power supply unit, said power-control switch, and a multiplex selector via control lines to perform unbalanced current comparison, phase comparison, current/voltage deviation test, and fusion heat ($I^2T$) measurement;

a signal converting unit, used to convert said power supply-current signal $I_1$, said consumed-current signal $I_2$, and said voltage signal $V_{in}$ into corresponding digital signals, wherein said corresponding digital signals is transmitted via a data bus to said primary processing unit and then processed there; and the multiplex selector, controlled by said primary processing unit, being used to selectively transmit said power supply-current signal $I_1$, said consumed-current signal $I_2$, and said voltage signal $V_{in}$, to said signal converting unit.

2. The inverter test device according to claim 1, wherein the number of said inverter may be single or multiple; the input power sources of multiple said inverters are commonly connected to each other, and the secondary sides of the high-voltage outputs of said inverters are separately connected to independent said signal channels $Vch_n$ (n=1~n).

3. The inverter test device according to claim 1, wherein said load may be one or a plurality of Cold Cathode Fluorescent Lamps or equivalent impedances or equivalent circuits.

4. A test method applying to the test device of claim 1, which utilizes said device to provide a single-load test environment or a multi-load test environment and utilizes the test programs inside said primary processing unit to perform electrical performance tests on said inverter, including: unbalanced current comparison, phase comparison, current/voltage deviation, and fusion heat ($I^2T$) measurement.

5. The test method according to claim 4, wherein said unbalanced current comparison test comprises the following steps:

(a-1) Switching on power, wherein said power-control switch is switched on, and said power supply unit provides power for said inverter, and the power supply is maintained for a preset interval so that the system can achieve a stable state;

(a-2) Obtaining the current value of each said load;

(a-3) Calculating and recording the average current value of each said load or the current RMS (Root Means Square) value of each said load;

(a-4) Calculating the current values of said loads near the top side, determining whether they are in an ascendant sequence or a descendant sequence, and recording the result;

(a-5) Calculating the current values of said loads near the bottom side, determining whether they are in an ascendant sequence or a descendant sequence, and recording the result;

(a-6) Calculating the current values of said loads at the central portion, determining whether they are within a preset range, and recording the result; and (a-7) Determining whether the recorded results conform to the preset current distribution, and recording /outputting the result as a test report.

6. The test method according to claim 5, wherein in said step (a-2), said multiplex selector is utilized to select said current-sampling channels $Ich_n$ (n=1~n) in order to obtain said consumed-current signal $I_2$ of said load corresponding to each said current-sampling channel $Ich_n$ (n=1~n), and then said signal converting unit converts said consumed-current signal $I_2$ into a corresponding digital signal of the current of said load.

7. The test method according to claim 5, wherein in said step (a-3), said consumed-current signal $I_2$ of said load corresponding to each said current-sampling channel $Ich_n$ (n=1~n) is sampled several times, and the values are calculated to obtain the average value or the RMS value.

8. The test method according to claim 4, wherein said phase comparison test comprises the following steps:

(b-1) Switching on power, wherein said power supply unit provides power for said inverters, and said power supply is maintained for a preset interval so that the system can achieve a stable state;

(b-2) Selecting said signal channels $Vch_n$ (n=1~n) to be used in comparing phases, and obtaining said voltage signals $V_{in}$ output by said inverters;

(b-3) Converting said voltage signals $V_{in}$ into corresponding digital signals; and (b-4) Calculating the phase difference between said selected signal channels.

9. The test method according to claim 8, wherein in said step (b-2), said multiplex selector is utilized to select said signal channels $Vch_n$ (n=1~n) to be used in comparing phases, and said current/voltage detection unit is used to obtain said voltage signals $V_{in}$.

10. The test method according to claim 8, wherein sin aid step (b-4), under the condition that said signal channels cross three cross-zero points, the distances between said cross-zero points of the voltage values of said signal channels and are compared to obtain the phase difference between said signal channels.

11. The test method according to claim 4, wherein said current/voltage deviation test comprises the following steps:

(c-1) Switching on power, wherein said power supply unit provides power for said inverters, and said power supply is maintained for a preset interval so that the system can achieve a stable state;

(c-2) Selecting the channel of said inverter intended to be test, and obtaining the voltage value of said voltage signal $V_{in}$ of said load or the current value of said consumed-current signal $I_2$ of said load;

(c-3) Reading the voltage value or the current value of the selected channel repeatedly by the time interval $\Delta T$ with the length of a preset number of cycles, and recording it;

(c-4) When the preset test time Ttest is reached, calculating the power waveform deviation according to Formulus-1:

$$\text{Power waveform deviation}=(\Sigma Imax^{+}-\Sigma Imax^{-})/\text{average value (or RMS value)} \quad \text{(Formulus-1)}; \text{ and}$$

(c-5) Comparing the calculation result with the preset deviation, and recording /outputting the comparison result.

12. The test method according to claim 11, wherein in said step (c-2), said current/voltage detection unit is used to obtain the voltage values of said voltage signals $V_{in}$ or the current values of said consumed-current signals $I_2$, and said multiplex selector is used to select the channel intended for the deviation test, and then, said signal converting unit converts said voltage signals $V_{in}$ or said consumed-current signals $I_2$ into corresponding digital values of voltage or current.

13. The test method according to claim 4, wherein said fusion heat ($I^2T$) measurement test comprises the following steps:

(d-1) Switching on power, wherein the power supply unit provides power for the inverter;

(d-2) Obtaining the current values of said power supply-current signals $I_1$ with a given sampling frequency f within a preset test time T, and recording them as $I_n$ (n=1~n), wherein the interval between two sampling actions is ΔT, and $$T = \sum_{n=1}^{n} \Delta T_n;$$

(d-3) Calculating said fusion heat ($I^2T$) according to Formulus-2, and recording the calculation result, wherein $$\sum_{n=1}^{n} \Delta T_n \cdot I_n[T_n] \cdot I_n[T_n]; \quad \text{(Formulus-2)}$$

(d-4) Comparing the calculation result with the preset fusion heat, and recording /outputting the comparison result.

* * * * *